(12) United States Patent
Daimon et al.

(10) Patent No.: US 11,444,601 B2
(45) Date of Patent: Sep. 13, 2022

(54) ACOUSTIC WAVE DEVICE (71) Applicant: Murata Manufacturing Co., Ltd., Nagaokakyo (JP)

(72) Inventors: Katsuya Daimon, Nagaokakyo (JP); Takuya Koyanagi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 64 days.

(21) Appl. No.: 17/009,810

(22) Filed: Sep. 2, 2020

(65) Prior Publication Data
US 2020/0403603 A1 Dec. 24, 2020

Related U.S. Application Data (63) Continuation of application No. PCT/JP2019/010286, filed on Mar. 13, 2019.

(30) Foreign Application Priority Data

Mar. 14, 2018 (JP) .............................. JP2018-046241

(51) Int. Cl.
| H03H 9/64 | (2006.01) |
| H03H 9/02 | (2006.01) |
| H03H 9/145 | (2006.01) |
| H03H 9/25 | (2006.01) |

(52) U.S. Cl.
CPC ...... *H03H 9/6496* (2013.01); *H03H 9/02559* (2013.01); *H03H 9/02637* (2013.01);
(Continued)

(58) Field of Classification Search
CPC ............. H03H 9/6496; H03H 9/02559; H03H 9/02637; H03H 9/02866; H03H 9/02992;
(Continued)

(56) References Cited

U.S. PATENT DOCUMENTS

2009/0295507 A1 12/2009 Kando et al.
2012/0161577 A1 6/2012 Abbott et al.
(Continued)

FOREIGN PATENT DOCUMENTS

JP 2003-032080 A 1/2003
JP 2012-186808 A 9/2012
(Continued)

OTHER PUBLICATIONS

Official Communication issued in International Patent Application No. PCT/JP2019/010286, dated May 28, 2019.

*Primary Examiner* — Rakesh B Patel
*Assistant Examiner* — Jorge L Salazar, Jr.
(74) *Attorney, Agent, or Firm* — Keating & Bennett, LLP (57) ABSTRACT

An acoustic wave device including series arm resonators including a first IDT electrode and parallel arm resonators including a second IDT electrode, in the first IDT electrode, a first envelope obliquely extends with respect to the acoustic wave propagation direction, and a second envelope obliquely extends with respect to the acoustic wave propagation direction, the second IDT electrode includes a central region, a first low acoustic velocity region in which an acoustic velocity is lower than an acoustic velocity in the central region, a second low acoustic velocity region in which an acoustic velocity is lower than the acoustic velocity in the central region, a first high acoustic velocity region in which an acoustic velocity is higher than the acoustic velocity in the central region, and a second high acoustic velocity region in which an acoustic velocity is higher than the acoustic velocity in the central region.

18 Claims, 7 Drawing Sheets

(52) U.S. Cl.
CPC .... *H03H 9/02866* (2013.01); *H03H 9/02992* (2013.01); *H03H 9/1457* (2013.01); *H03H 9/14594* (2013.01); *H03H 9/25* (2013.01); *H03H 9/6483* (2013.01)

(58) Field of Classification Search
CPC .... H03H 9/1457; H03H 9/14594; H03H 9/25; H03H 9/6483; H03H 9/14541; H03H 9/02574; H03H 9/14547; H03H 9/14558; H03H 9/14573
USPC .......................................... 333/133, 193–196
See application file for complete search history.

(56) References Cited

U.S. PATENT DOCUMENTS

| | | | |
|---|---|---|---|
| 2013/0285768 A1* | 10/2013 | Watanabe | H03H 3/02 333/193 |
| 2014/0049340 A1 | 2/2014 | Inoue | |
| 2016/0182010 A1 | 6/2016 | Nakamura et al. | |
| 2017/0250674 A1 | 8/2017 | Takamine et al. | |
| 2018/0097508 A1 | 4/2018 | Iwamoto et al. | |
| 2020/0067489 A1 | 2/2020 | Takata | |
| 2020/0212891 A1 | 7/2020 | Daimon | |

FOREIGN PATENT DOCUMENTS

| | | |
|---|---|---|
| JP | 2014-039199 A | 2/2014 |
| JP | 2016-119569 A | 6/2016 |
| KR | 10-2016-0075305 A | 6/2016 |
| KR | 10-2017-0086628 A | 7/2017 |
| KR | 10-2017-0134623 A | 12/2017 |
| WO | 2008/126614 A1 | 10/2008 |
| WO | 2016/208446 A1 | 12/2016 |
| WO | 2018/225650 A1 | 12/2018 |
| WO | 2019/059208 A1 | 3/2019 |

* cited by examiner

ACOUSTIC WAVE DEVICE

CROSS REFERENCE TO RELATED APPLICATIONS

This application claims the benefit of priority to Japanese Patent Application No. 2018-046241 filed on Mar. 14, 2018 and is a Continuation Application of PCT Application No. PCT/JP2019/010286 filed on Mar. 13, 2019. The entire contents of each application are hereby incorporated herein by reference.

BACKGROUND OF THE INVENTION

1. Field of the Invention

The present invention relates to an acoustic wave device including an IDT electrode provided on a piezoelectric body layer.

2. Description of the Related Art

A ladder filter having a configuration in which a plurality of resonators are connected to define series arms and parallel arms has been widely used as a filter for a mobile phone or the like. An acoustic wave device is used for such a ladder filter.

As an example of such an acoustic wave device, International Publication No. 2016/208446 discloses a multilayer body in which a low acoustic velocity film and a piezoelectric body layer are disposed in this order on a support substrate, and an acoustic wave device in which an IDT electrode is provided on the piezoelectric body layer of the multilayer body. The acoustic wave device including such a multilayer body is capable of increasing the Quality factor, but on the other hand, there is a problem in that a transverse mode ripple is generated in the frequency characteristic.

In order to suppress the transverse mode ripple, in International Publication No. 2016/208446, an inclined IDT electrode is used. In the inclined IDT electrode, an envelope which is an imaginary line formed by connecting tips of a plurality of electrode fingers connected to one busbar and an envelope which is an imaginary line formed by connecting tips of a plurality of electrode fingers connected to the other busbar obliquely extend with respect to an acoustic wave propagation direction.

However, when the inclined IDT electrode is used, the transverse mode ripple may be suppressed, whereas the response at the upper end of the stop band (region where the wavelength of an acoustic wave becomes constant since the acoustic wave is confined in the grating) becomes large in some cases. In particular, in an acoustic wave device having a multilayer body as disclosed in International Publication No. 2016/208446, since the efficiency of confining acoustic wave energy in the thickness direction of the multilayer body is high, the tendency is remarkable. Therefore, when an acoustic wave resonator including such an inclined IDT electrode is used for the ladder filter, the filter characteristic is deteriorated in some cases.

SUMMARY OF THE INVENTION

Preferred embodiments of the present invention provide acoustic wave devices that are each capable of reducing or preventing both transverse mode ripple and a response at an upper end of a stop band.

An acoustic wave device according to a preferred embodiment of the present invention includes a piezoelectric body layer including a first main surface and a second main surface opposing each other; a high acoustic velocity member which is disposed on the first main surface of the piezoelectric body layer and in which an acoustic velocity of a bulk wave propagating therethrough is higher than an acoustic velocity of an acoustic wave propagating through the piezoelectric body layer; and a plurality of IDT electrodes provided on the second main surface of the piezoelectric body layer. A plurality of acoustic wave resonators include the piezoelectric body layer, the high acoustic velocity member, and the plurality of IDT electrodes. The plurality of acoustic wave resonators include at least one series arm resonator including a first IDT electrode and at least one parallel arm resonator including a second IDT electrode. The first IDT electrode includes a plurality of first electrode fingers and a plurality of second electrode fingers interdigitating each other. A first envelope which is an imaginary line connecting tips of the plurality of first electrode fingers obliquely extends with respect to an acoustic wave propagation direction and a second envelope which is an imaginary line connecting tips of the plurality of second electrode fingers obliquely extends with respect to the acoustic wave propagation direction. The second IDT electrode includes a first busbar and a second busbar facing each other, a plurality of third electrode fingers of which one end is connected to the first busbar, and a plurality of fourth electrode fingers of which one end is connected to the second busbar and which are interdigitating with the plurality of third electrode fingers. The second IDT electrode includes an interdigitation region in which the third electrode fingers and the fourth electrode fingers overlap with each other in the acoustic wave propagation direction, and the interdigitation region includes a central region located in a central portion in a direction orthogonal or substantially orthogonal to the acoustic wave propagation direction, a first low acoustic velocity region which is disposed towards the first busbar relative to the central region and in which an acoustic velocity is lower than an acoustic velocity in the central region, and a second low acoustic velocity region which is disposed towards the second busbar relative to the central region and in which an acoustic velocity is lower than the acoustic velocity in the central region. The second IDT electrode includes a first high acoustic velocity region which is disposed towards the first busbar relative to the interdigitation region in the direction orthogonal or substantially orthogonal to the acoustic wave propagation direction and in which an acoustic velocity is higher than the acoustic velocity in the central region, and a second high acoustic velocity region which is disposed towards the second busbar relative to the interdigitation region in the direction orthogonal or substantially orthogonal to the acoustic wave propagation direction and in which an acoustic velocity is higher than the acoustic velocity in the central region.

According to preferred embodiments of the present invention, it is possible to provide acoustic wave devices that are each capable of reducing or preventing both a transverse mode ripple and a response at an upper end of a stop band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing examples of preferred embodiments of the present invention with reference to the accompanying drawings.

It should be noted that the preferred embodiments described in this description are merely exemplary, and that a partial replacement or a combination of configurations is possible between different preferred embodiments.

First Preferred Embodiment

Figure 1:
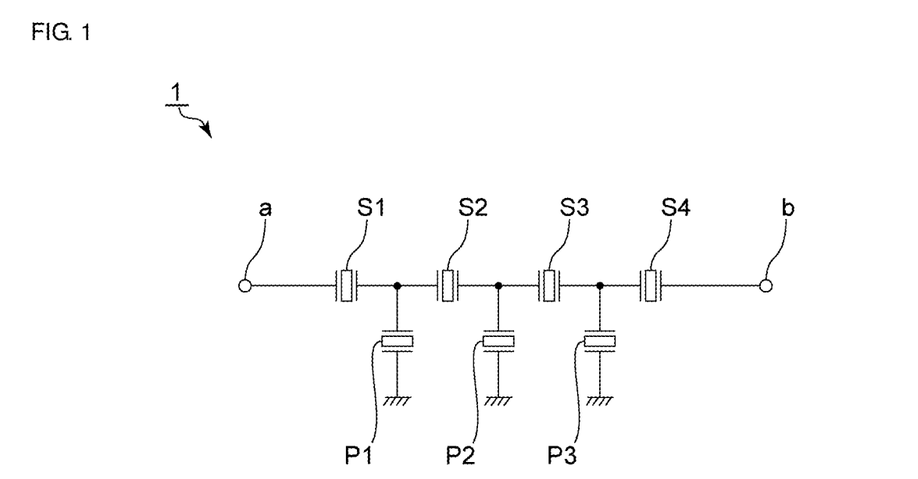
FIG. 1 is a circuit diagram of an acoustic wave device according to a first preferred embodiment of the present invention.

FIG. 1 is a circuit diagram of an acoustic wave device according to a first preferred embodiment of the present invention.

As illustrated in FIG. 1, an acoustic wave device 1 is a ladder filter including a plurality of series arm resonators S1 to S4 and a plurality of parallel arm resonators P1 to P3. Each of the plurality of series arm resonators S1 to S4 and the plurality of parallel arm resonators P1 to P3 is an acoustic wave resonator.

The acoustic wave device 1 includes an input terminal "a" provided at one end and an output terminal "b" provided at the other end. In a series arm connecting the input terminal "a" and the output terminal "b", the plurality of series arm resonators S1 to S4 are provided. In addition, one parallel arm resonator is provided in each parallel arm in a plurality of parallel arms connecting the series arm and the ground potential. In FIG. 1, the parallel arm resonators P1 to P3 are provided in the three parallel arms, respectively.

The acoustic wave device 1 including the series arm resonators S1 to S4 and the parallel arm resonators P1 to P3 includes a support substrate, a low acoustic velocity film, a piezoelectric body layer, and an IDT electrode.

Figure 2:
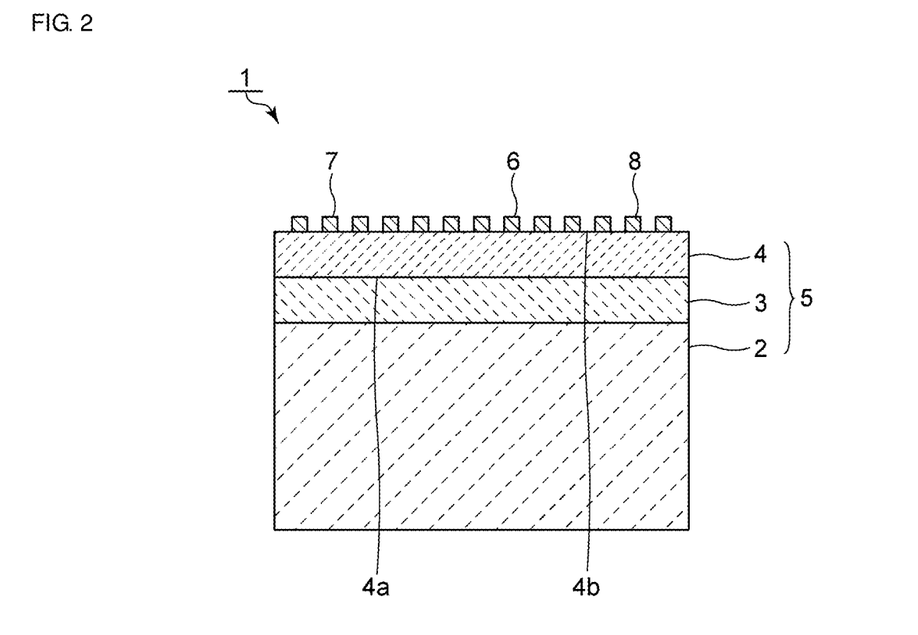
FIG. 2 is a schematic elevational cross-sectional view illustrating the acoustic wave device according to the first preferred embodiment of the present invention.

FIG. 2 is a schematic elevational cross-sectional view illustrating the acoustic wave device according to the first preferred embodiment of the present invention.

As illustrated in FIG. 2, the acoustic wave device 1 includes a support substrate 2. A low acoustic velocity film 3 is provided on the support substrate 2. A piezoelectric body layer 4 is provided on the low acoustic velocity film 3. Here, the low acoustic velocity film 3 is a film in which the acoustic velocity of a bulk wave propagating therethrough is lower than the acoustic velocity of the bulk wave propagating through the piezoelectric body layer 4.

The piezoelectric body layer 4 may be made of, for example, a piezoelectric single crystal such as lithium tantalate ($LiTaO_3$) or lithium niobate ($LiNbO_3$), or may be made of an appropriate piezoelectric ceramic such as zinc oxide (ZnO), aluminum nitride (AlN), quartz ($SiO_2$), or PZT.

In the present preferred embodiment, the low acoustic velocity film 3 is preferably made of silicon oxide, for example. More specifically, the silicon oxide is represented by $SiO_x$, and the low acoustic velocity film 3 is preferably made of $Si_2$, for example. Note that the low acoustic velocity film 3 may be made of silicon oxide of which x is a positive number other than 2. Alternatively, the low acoustic velocity film 3 may be made of, for example, a material containing a compound obtained by adding fluorine, carbon, or boron to glass, silicon oxynitride, tantalum oxide, or silicon oxide as a main component, or the like. The material of the low acoustic velocity film 3 may be a material having a relatively low acoustic velocity.

In the present preferred embodiment, the support substrate 2 is a high acoustic velocity member in which an acoustic velocity of a bulk wave propagating therethrough is higher than an acoustic velocity of an acoustic wave propagating through the piezoelectric body layer 4. More specifically, the support substrate 2 is preferably made of Si, for example. Note that the high acoustic velocity material of the support substrate 2 may be, for example, aluminum nitride, aluminum oxide, silicon carbide, silicon oxynitride, a material containing a diamond-like carbon (DLC) film or diamond as a main component, or the like. Note that the high acoustic velocity material may be a material having a relatively high acoustic velocity.

As described above, the acoustic wave device 1 includes a multilayer body 5 in which the support substrate 2 as the high acoustic velocity member, the low acoustic velocity film 3, and the piezoelectric body layer 4 are laminated in this order. Since the acoustic wave device 1 includes the multilayer body 5 described above, it is possible to effectively confine the acoustic wave in the piezoelectric body layer 4 side.

The piezoelectric body layer 4 includes a first main surface 4a and a second main surface 4b that are opposed to each other. The first main surface 4a of the piezoelectric body layer 4 is in contact with the low acoustic velocity film 3. An IDT electrode 6 is provided on the second main surface 4b of the piezoelectric body layer 4. When an alternating voltage is applied to the IDT electrode 6, the acoustic wave is excited. The IDT electrode 6 preferably includes a laminated metal film in which an Al electrode layer is laminated on a Ti electrode layer. It should be noted that the material of the IDT electrode 6 is not limited to the above. The IDT electrode 6 may include a single layer metal film, or may be include a laminated metal film in which a plurality of metal layers are laminated.

A reflector 7 and a reflector 8 are provided at both sides of the IDT electrode 6 in an acoustic wave propagation direction on the second main surface 4b of the piezoelectric body layer 4. The reflector 7 and the reflector 8 are preferably made of the same material as the IDT electrode 6.

More specifically, each of the series arm resonators S1 to S4 of the acoustic wave device 1 is an acoustic wave resonator including an inclined first IDT electrode as the IDT electrode 6. In addition, each of the parallel arm resonators P1 to P3 of the acoustic wave device 1 is an acoustic wave resonator using a piston mode. Hereinafter, this will be described in detail.

Figure 3:
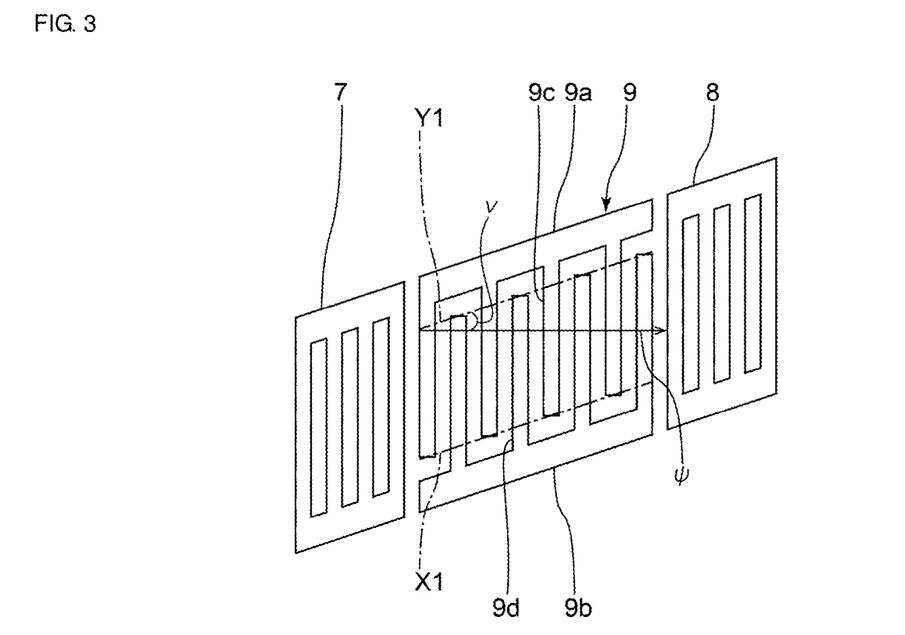
FIG. 3 is a schematic plan view illustrating an electrode structure of a series arm resonator in the acoustic wave device according to the first preferred embodiment of the present invention.

FIG. 3 is a schematic plan view illustrating an electrode structure of a series arm resonator in an acoustic wave device according to the first preferred embodiment of the present invention.

Each of the series arm resonators S1 to S4 includes a first IDT electrode 9 illustrated in a plan view in FIG. 3. The first IDT electrode 9 includes a first busbar 9a and a second busbar 9b which face each other. The first IDT electrode 9 includes a plurality of first electrode fingers 9c, one ends of which are connected to the first busbar 9a. Further, the first IDT electrode 9 includes a plurality of second electrode fingers 9d, one ends of which are connected to the second busbar 9b. The plurality of first electrode fingers 9c and the plurality of second electrode fingers 9d are interdigitating each other.

A first envelope X1, which is an imaginary line connecting the tips of the plurality of first electrode fingers 9c, obliquely extends with respect to the acoustic wave propagation direction ψ. Similarly, the second envelope Y1, which is an imaginary line connecting the tips of the plurality of second electrode fingers 9d, obliquely extends with respect to the acoustic wave propagation direction ψ. As described above, the first IDT electrode 9 is the inclined IDT electrode in which the first envelope X1 and the second envelope Y1 obliquely extend with respect to the acoustic wave propagation direction. Since the series arm resonators S1 to S4 include the inclined first IDT electrode 9, it is possible to reduce or prevent the transverse mode ripple.

The inclination angle defined by the direction, in which the first envelope X1 and the second envelope Y1 extend, and the acoustic wave propagation direction ψ is not particularly limited, but in the present preferred embodiment, the inclination angle v is preferably about 7.5 degrees, for example. Thus, in preferred embodiments of the present invention, it is preferable that the inclination angle v defined by the direction, in which the first envelope X1 and the second envelope Y1 extend, and the acoustic wave propagation direction is about 2.5 degrees or more, for example. In this case, it is possible to more reliably reduce or prevent the transverse mode ripple. The upper limit of the inclination angle v may preferably be set to, for example, about 15 degrees.

Figure 4:
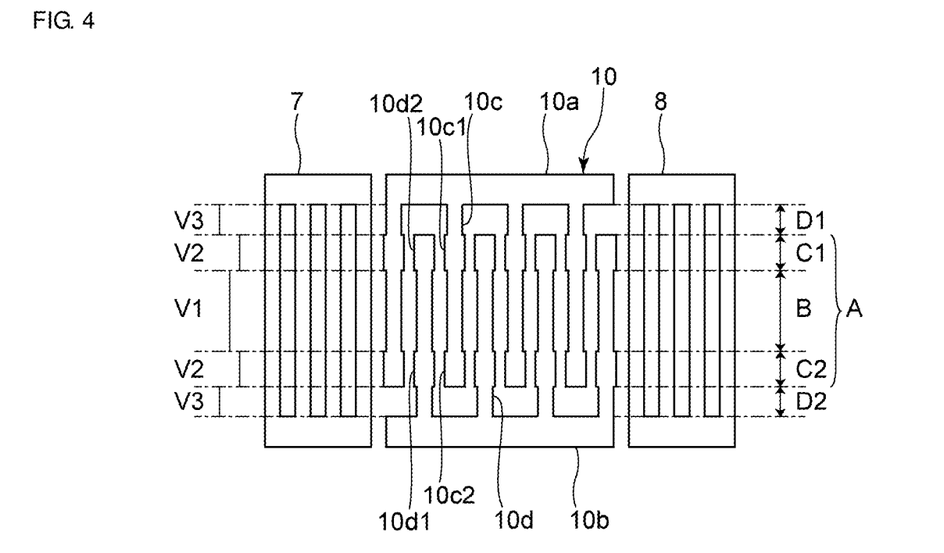
FIG. 4 is a schematic plan view illustrating an electrode structure of a parallel arm resonator in the acoustic wave device according to the first preferred embodiment of the present invention.

FIG. 4 is a schematic plan view illustrating an electrode structure of the parallel arm resonator constituting the acoustic wave device according to the first preferred embodiment of the present invention.

Each of the parallel arm resonators P1 to P3 includes a second IDT electrode 10 illustrated in a plan view in FIG. 4. The second IDT electrode 10 includes a first busbar 10a and a second busbar 10b which face each other. The second IDT electrode 10 includes a plurality of third electrode fingers 10c, one ends of which are connected to the first busbar 10a. Further, the second IDT electrode 10 includes a plurality of fourth electrode fingers 10d, one ends of which are connected to the second busbar 10b. The plurality of third electrode fingers 10c and the plurality of fourth electrode fingers 10d are interdigitating each other.

In the second IDT electrode 10, a portion where the third electrode fingers 10c and the fourth electrode fingers 10d overlap with each other in the acoustic wave propagation direction corresponds to an interdigitation region A. The interdigitation region A includes a central region B located in the central portion in a direction orthogonal or substantially orthogonal to the acoustic wave propagation direction. The interdigitation region A includes a first edge region C1 disposed towards the first busbar 10a side of the central region B and a second edge region C2 disposed towards the second busbar 10b side of the central region B. Here, a dimension of the third electrode finger 10c and the fourth electrode finger 10d along the acoustic wave propagation direction is defined as a width. The plurality of third electrode fingers 10c include a wide portion 10c1 and a wide portion 10c2 which are wider than other portions in the first edge region C1 and the second edge region C2. Similarly, the plurality of fourth electrode fingers 10d include a wide portion 10d1 and a wide portion 10d2 which are wider than other portions in the first edge region C1 and the second edge region C2. In the present preferred embodiment, the third electrode finger 10c and the fourth electrode finger 10d include the wide portion 10c1 and the wide portion 10d2, such that a first low acoustic velocity region having an acoustic velocity lower than the acoustic velocity in the central region B is provided in the first edge region C1. Similarly, the third electrode finger 10c and the fourth electrode finger 10d include the wide portion 10c2 and the wide portion 10d1, such that a second low acoustic velocity region having an acoustic velocity lower than the acoustic velocity in the central region B is provided in the second edge region C2. Here, when the acoustic velocity in the central region is denoted as V1, and the acoustic velocity in the first low acoustic velocity region and the second low acoustic velocity region is denoted as V2, V2<V1 is satisfied.

The second IDT electrode 10 includes a first outer side region D1 disposed in the outer side of the interdigitation region A in the direction orthogonal or substantially orthogonal to the acoustic wave propagation direction. Further, the second IDT electrode 10 includes a second outer side region D2 disposed in the outer side of the interdigitation region A in the direction orthogonal or substantially orthogonal to the acoustic wave propagation direction. In the present preferred embodiment, the first outer side region D1 is located between the first edge region C1 and the first busbar 10a. The second outer side region D2 is located between the second edge region C2 and the second busbar 10b.

In the first outer side region D1, only the third electrode finger 10c is provided of the third electrode finger 10c and the fourth electrode finger 10d. In the second outer side region D2, only the fourth electrode finger 10d is provided of the third electrode finger 10c and the fourth electrode finger 10d. Accordingly, the acoustic velocity in the first outer side region D1 and the second outer side region D2 is higher than the acoustic velocity in the central region B.

When the acoustic velocity of the acoustic wave in the first outer side region D1 and the second outer side region D2 is denoted as V3, V1<V3 is satisfied. In this way, the first high acoustic velocity region is provided in the first outer side region D1, and the second high acoustic velocity region is provided in the second outer side region D2.

The relationship between the acoustic velocities is V2<V1<V3. The relationship between the acoustic velocities described above is illustrated in FIG. 4. FIG. 4 indicates that the acoustic velocity is higher toward the left side.

In the second IDT electrode 10, the first low acoustic velocity region and the second low acoustic velocity region are disposed in the outer side of the central region B in the direction orthogonal or substantially orthogonal to the acoustic wave propagation direction. A first high acoustic velocity region and a second high acoustic velocity region are disposed in the outer side of the first low acoustic velocity region and the second low acoustic velocity region in the direction orthogonal or substantially orthogonal to the acoustic wave propagation direction. As described above, the parallel arm resonators P1 to P3 use the piston mode, and it is possible to reduce or prevent both the transverse mode ripple and the response at the upper end of the stop band. Note that the stop band refers to a region in which the wavelength of the acoustic wave becomes constant since the acoustic wave is confined in the metal grating having a periodic structure.

Thus, in the present preferred embodiment, the series arm resonators S1 to S4 include the inclined IDT electrode, and the parallel arm resonators P1 to P3 are acoustic wave resonators that use the piston mode. Therefore, in the acoustic wave device 1, it is possible to reduce or prevent both the transverse mode ripple and the response at the upper end of the stop band.

Figure 5:
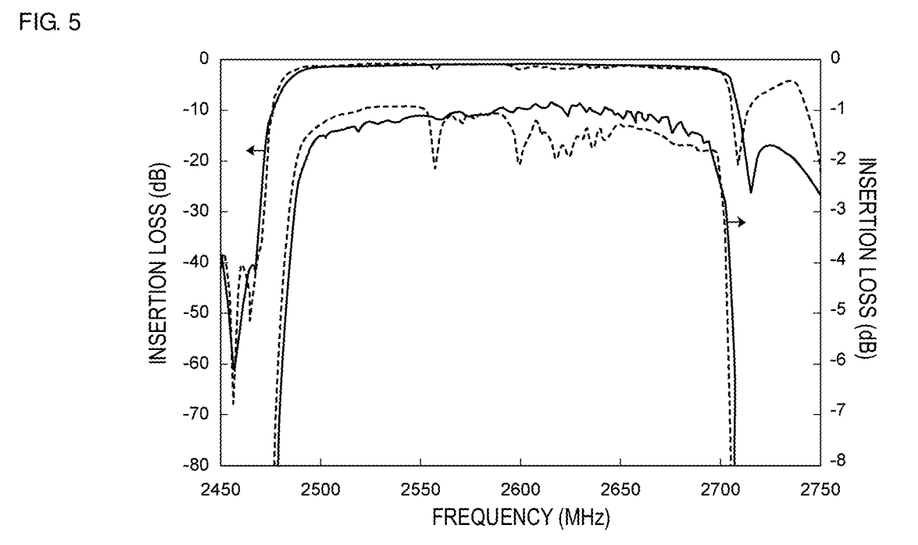
FIG. 5 is a diagram describing an attenuation frequency characteristic of the acoustic wave devices according to the first preferred embodiment and a comparative example of the present invention.

Next, the acoustic wave device 1 of the first preferred embodiment was manufactured with the following parameters.
Material and thickness of the first IDT electrode 9: Ti: about 10 nm/Al: about 100 nm
Wavelength of the first IDT electrode 9: about 1.5 μm
Number of pairs of the electrode fingers in the first IDT electrode 9: 150 pairs
Duty of the first IDT electrode 9: about 0.5
Wavelength of the reflectors 7 and 8 on both sides of the first IDT electrode 9: about 1.5 μm
Number of pairs of the electrode fingers in the reflectors 7 and 8 on both sides of the first IDT electrode 9: 20 pairs
Material and thickness of the second IDT electrode 10: Ti: about 10 nm/Al: about 100 nm
Wavelength of the second IDT electrode 10: about 1.5 μm
Number of pairs of the electrode fingers in the second IDT electrode 10: 150 pairs
Duty of the second IDT electrode 10: about 0.45
Wavelength of the reflectors 7 and 8 on both sides of the second IDT electrode 10: about 1.52 μm
Number of pairs of the electrode fingers in the reflectors 7 and 8 on both sides of the second IDT electrode 10: 20 pairs
Piezoelectric body layer 4: material: $LiTaO_3$, cut angle about 50°, thickness about 600 nm
Low acoustic velocity film 3: material: $SiO_2$, thickness about 600 nm
Support substrate 2: material: Si, thickness about 500 μm FIG. 5 is a diagram illustrating an attenuation frequency characteristic of the acoustic wave device according to the first preferred embodiment of the present invention. In FIG. 5, the attenuation frequency characteristic of the acoustic wave device of the first preferred embodiment is described by a solid line. Further in FIG. 5, the attenuation frequency characteristic of an acoustic wave device of a comparative example is described by a broken line. In the comparative example, an acoustic wave device was manufactured in the same or similar manner as in the first preferred embodiment, except that the inclined first IDT electrode 9 was also included in the parallel arm resonators P1 to P3.

As illustrated in FIG. 5, it was discovered that both the transverse mode ripple and the response at the upper end of the stop band were reduced or prevented, and a favorable filter characteristic is achieved in the acoustic wave device 1 of the first preferred embodiment. On the other hand, in the acoustic wave device also including the inclined first IDT electrode 9 in the parallel arm resonators P1 to P3, the response at the upper end of the stop band is large. Therefore, it was discovered that the insertion loss is deteriorated, and the filter characteristic is deteriorated.

It is possible to describe the reason for the above with reference to FIG. 6 to FIG. 8 below.

Figure 6:
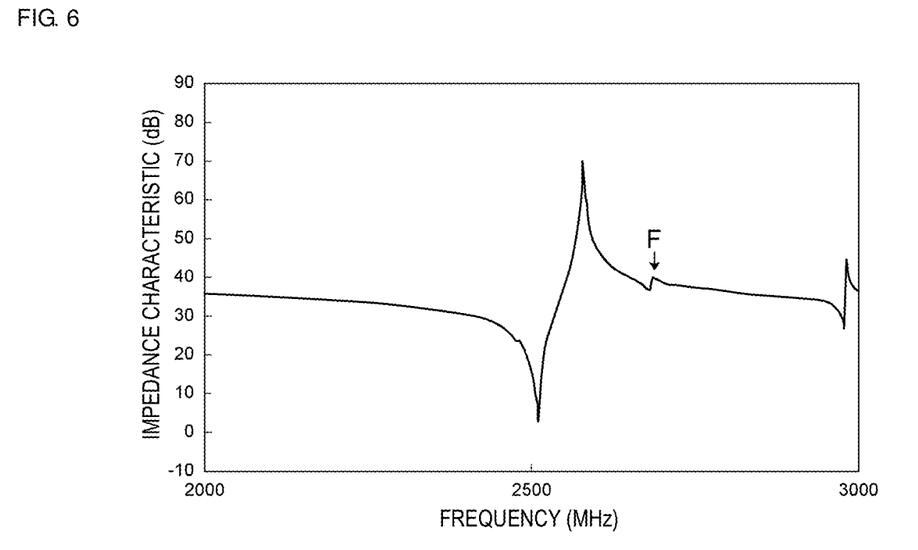
FIG. 6 is a diagram describing an impedance characteristic of an acoustic wave resonator including an inclined first IDT electrode.

FIG. 6 is a diagram describing an impedance characteristic of the acoustic wave resonator including the inclined first IDT electrode. FIG. 7 is a diagram describing an impedance characteristic of the acoustic wave resonator including the second IDT electrode and using the piston mode.

As indicated by an arrow F in FIG. 6, it was discovered that the response at the upper end of the stop band is largely generated in the acoustic wave resonator including the inclined first IDT electrode 9. On the other hand, as indicated by an arrow G in FIG. 7, it was discovered that the response at the upper end of the stop band is reduced or prevented in the acoustic wave resonator using the piston mode.

Figure 8:
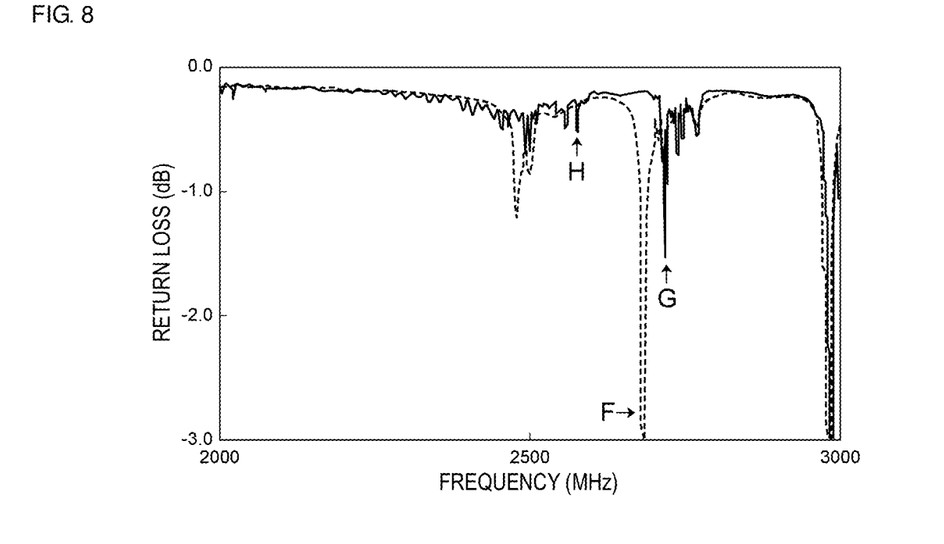
FIG. 8 is a diagram describing a return loss of the acoustic wave resonator including the inclined first IDT electrode and an acoustic wave resonator using a piston mode.

FIG. 8 is a diagram describing the return loss of the acoustic wave resonator including the inclined first IDT electrode and the return loss of the acoustic wave resonator using the piston mode. In FIG. 8, a solid line indicates the result of the acoustic wave resonator using the piston mode, and a broken line indicates the result of the acoustic wave resonator including the inclined IDT electrode.

Figure 7:
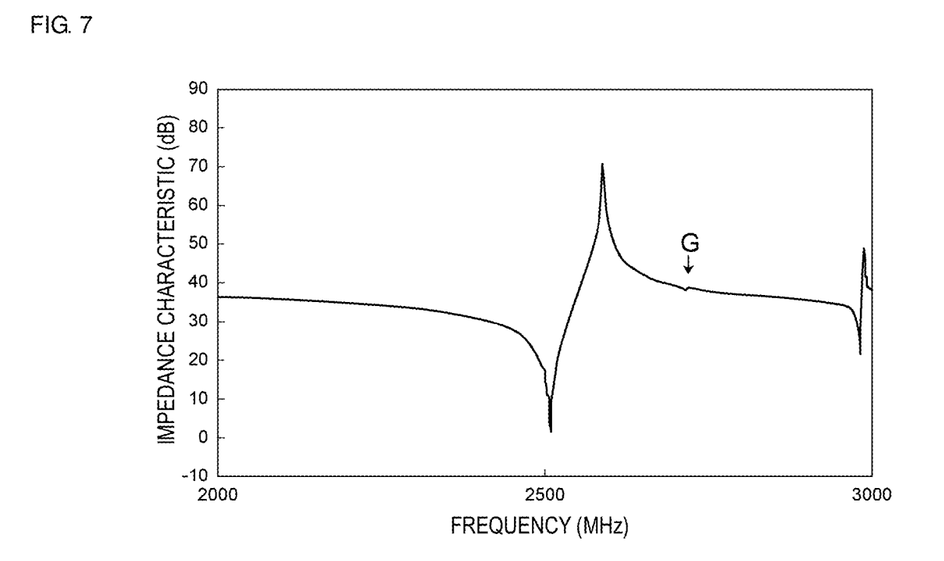
FIG. 7 is a diagram describing an impedance characteristic of an acoustic wave resonator using a piston mode.

As indicated by the arrow F and the arrow G in FIG. 8, a stop band response is reduced or prevented in the acoustic wave resonator using the piston mode, as in the results indicated in FIG. 6 and FIG. 7. Note that the stop band response refers to a response at the upper end of the stop band. In addition, as indicated by an arrow H in FIG. 8, the transverse mode ripple is sufficiently reduced or prevented in the acoustic wave resonator using the piston mode. On the other hand, it was discovered that the transverse mode ripple is further reduced or prevented in the acoustic wave resonator including the inclined first IDT electrode 9.

Both in the acoustic wave device 1 of the first preferred embodiment and the comparative example, the series arm resonators S1 to S4 are each acoustic wave resonators including the inclined first IDT electrode 9. Therefore, the transverse mode ripple is effectively reduced or prevented. In the series arm resonators S1 to S4, even in the case where the inclined first IDT electrode 9 is used, the response at the upper end of the stop band is generated at the outside of the band, and therefore, the filter characteristic is not affected as illustrated in FIG. 5. Here, in the acoustic wave device of the comparative example including the inclined first IDT electrode 9 in the parallel arm resonators P1 to P3, although the transverse mode ripple is reduced or prevented, the response at the upper end of the stop band is generated at the inside of the band as illustrated in FIG. 5, and the insertion loss is deteriorated. In this respect, in the acoustic wave device 1 of the first preferred embodiment, the parallel arm resonators P1 to P3 are acoustic wave resonators using the piston mode. Therefore, the response at the upper end of the stop band is reduced or prevented. Thus, in the acoustic wave device 1 of the first preferred embodiment, it is possible to reduce or prevent both the transverse mode ripple and the response at the upper end of the stop band, and the filter characteristics are excellent.

As described above, in the acoustic wave device 1 of the first preferred embodiment, the series arm resonators S1 to S4 include the inclined IDT electrode, and the parallel arm resonators P1 to P3 are the acoustic wave resonators using the piston mode. Therefore, in the acoustic wave device 1, it is possible to reduce or prevent both the transverse mode ripple and the response at the upper end of the stop band, and the filter characteristic is excellent.

Note that in the first preferred embodiment, all of the series arm resonators among the series arm resonators S1 to S4 include the inclined IDT electrodes, and all of the parallel arm resonators among the parallel arm resonators P1 to P3 use the piston mode. As described above, in the present preferred embodiment, it is preferable that all the series arm resonators include the inclined first IDT electrode, and all the parallel arm resonators use the piston mode. However, in preferred embodiments of the present invention, it is sufficient that at least one series arm resonator includes the inclined IDT electrode, and at least one parallel arm resonator includes the second IDT electrode and is the acoustic wave resonator using the piston mode. Also in the case above, it is possible to reduce or prevent both the transverse mode ripple and the response at the upper end of the stop band. However, in the band pass type acoustic wave filter, it is preferable that the parallel arm resonator, in which the upper end of the stop band is positioned within the pass band of the band pass type acoustic wave filter, is an acoustic wave resonator using the piston mode described above. In that case, it is possible to obtain a band pass acoustic wave filter which has more excellent filter characteristics.

Second Preferred Embodiment and Third Preferred Embodiment

Figure 9:
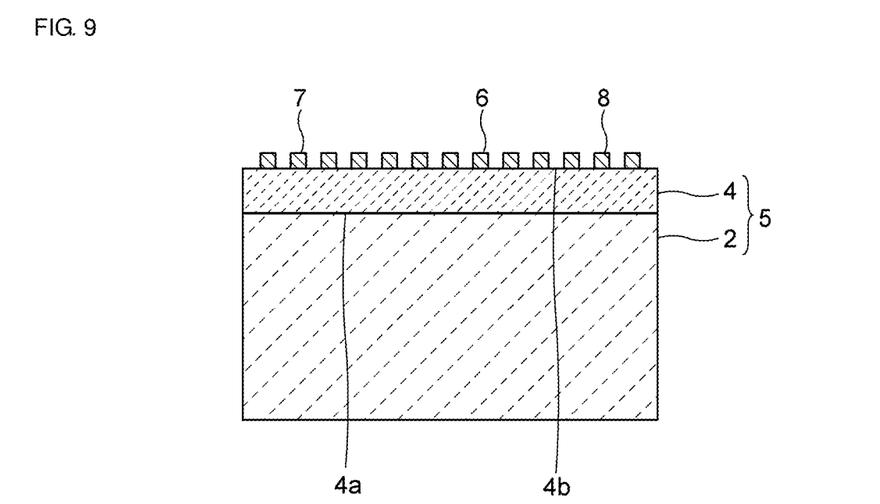
FIG. 9 is a schematic elevational cross-sectional view illustrating an acoustic wave device according to a second preferred embodiment of the present invention.

FIG. 9 is a schematic elevational cross-sectional view illustrating an acoustic wave device according to a second preferred embodiment of the present invention.

As illustrated in FIG. 9, in the second preferred embodiment, the low acoustic velocity film 3 is not provided, and the piezoelectric body layer 4 is laminated directly on the support substrate 2 which is the high acoustic velocity member. Other points are the same or substantially the same as those in the first preferred embodiment.

Figure 10:
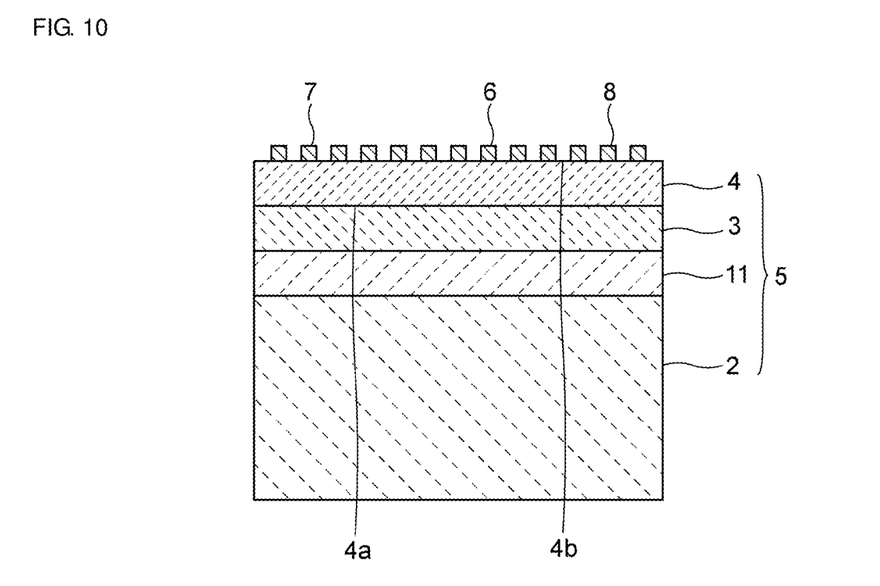
FIG. 10 is a schematic elevational cross-sectional view illustrating an acoustic wave device according to a third preferred embodiment of the present invention.

FIG. 10 is a schematic elevational cross-sectional view illustrating an acoustic wave device according to a third preferred embodiment of the present invention.

As illustrated in FIG. 10, the third preferred embodiment differs from the first preferred embodiment in that the high acoustic velocity member is a high acoustic velocity film 11. The high acoustic velocity film 11 is provided between the support substrate 2 and the low acoustic velocity film 3.

The high acoustic velocity film 11 is a member in which the acoustic velocity of the bulk wave propagating therethrough is higher than the acoustic velocity of the acoustic wave propagating through the piezoelectric body layer 4. The high acoustic velocity film 11 is preferably made of, for example, silicon nitride (SiN) in the present preferred embodiment. Note that the high acoustic velocity film 11 may be made of, for example, aluminum oxide, silicon carbide, silicon nitride, silicon oxynitride, silicon (Si), sapphire, lithium tantalate, lithium niobate, quartz, alumina, zirconia, cordierite, mullite, steatite, forsterite, magnesia, a diamond-like carbon (DLC) film or diamond, a medium containing the above material as a main component, a medium containing a mixture of the above materials as a main component, or the like. The material of the high acoustic velocity film 11 may be a material having a relatively high acoustic velocity.

In addition, in this case, the support substrate 2 may be made of other than the high acoustic velocity member. For example, the support substrate 2 may be made of a piezoelectric material, such as aluminum oxide, lithium tantalate, lithium niobate, or quartz; various ceramics such as alumina, magnesia, silicon nitride, aluminum nitride, silicon carbide, zirconia, cordierite, mullite, steatite, or forsterite; dielectric such as diamond, sapphire, or glass; a semiconductor such as gallium nitride; a resin, or the like. Other points are the same or substantially the same as those in the first preferred embodiment.

Also in the second preferred embodiment and the third preferred embodiment, the ladder filter includes the series arm resonators S1 to S4 including the inclined IDT electrode and the parallel arm resonators P1 to P3 using the piston mode. Therefore, it is possible to reduce or prevent both the transverse mode ripple and the response at the upper end of the stop band.

As in the second preferred embodiment, the support substrate 2 as a high acoustic velocity member may be directly laminated on the first main surface 4a of the piezoelectric body layer 4. As in the third preferred embodiment, the low acoustic velocity film 3, the high acoustic velocity film 11 as the high acoustic velocity member, and the support substrate 2 may be laminated in this order on the first main surface 4a of the piezoelectric body layer 4. In preferred embodiments of the present invention, the lamination structure of the multilayer body 5 is not particularly limited as long as the high acoustic velocity member is disposed directly or indirectly on the first main surface 4a of the piezoelectric body layer 4. By directly or indirectly disposing the high acoustic velocity member on the first main surface 4a of the piezoelectric body layer 4, it is possible to efficiently confine the energy of the acoustic wave in the piezoelectric body layer 4 side, and to increase the Quality factor.

Fourth Preferred Embodiment

Figure 11:
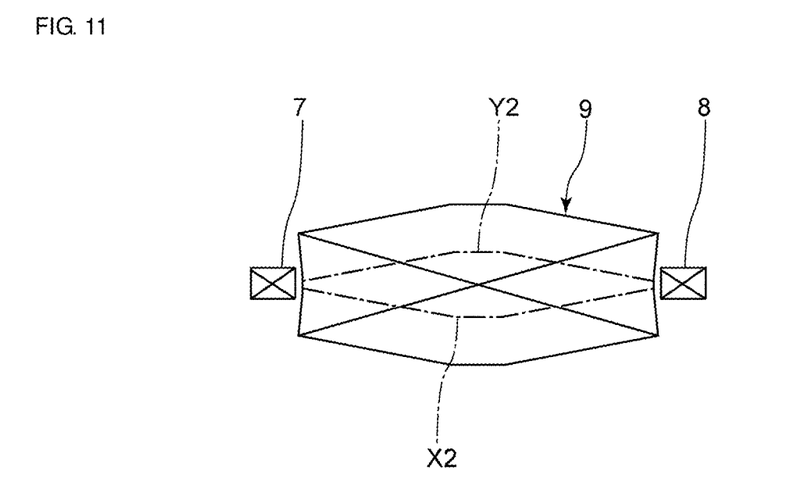
FIG. 11 is a schematic plan view illustrating an electrode structure of a series arm resonator in an acoustic wave device according to a fourth preferred embodiment of the present invention.

FIG. 11 is a schematic plan view illustrating an electrode structure of a series arm resonator in an acoustic wave device according to a fourth preferred embodiment of the present invention. In FIG. 11, the first IDT electrode 9, the reflector 7, and the reflector 8 are illustrated by a schematic diagram of a polygon to which two diagonal lines are added.

The planar shape of the first IDT electrode 9 in the fourth preferred embodiment is rhombic or substantially rhombic. The first envelope X2 and the second envelope Y2 in the first IDT electrode 9 include a portion obliquely extending with respect to the acoustic wave propagation direction and a portion extending in parallel or substantially in parallel with the acoustic wave propagation direction. Other points are the same or substantially the same as those in the first preferred embodiment.

Also in the fourth preferred embodiment, the ladder filter includes the series arm resonators S1 to S4 including the inclined IDT electrode and the parallel arm resonators P1 to P3 using the piston mode. Therefore, it is possible to reduce or prevent both the transverse mode ripple and the response at the upper end of the stop band.

As in the fourth preferred embodiment, the direction in which the first envelope X2 and the second envelope Y2 extend may be changed, and the planar shape of the inclined IDT electrode may be rhombic or substantially rhombic, for example. In the inclined IDT electrode, it is sufficient that at least the first envelope X2 and the second envelope Y2 include an inclined portion.

Fifth Preferred Embodiment

Figure 12:
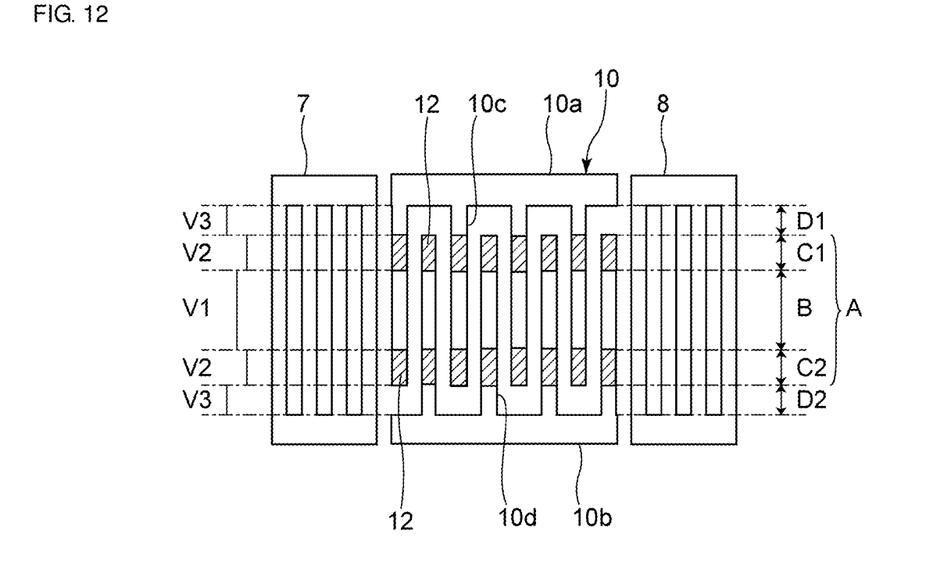
FIG. 12 is a schematic plan view illustrating an electrode structure of a parallel arm resonator in an acoustic wave device according to a fifth preferred embodiment of the present invention.

FIG. 12 is a schematic plan view illustrating an electrode structure of a parallel arm resonator in an acoustic wave device according to a fifth preferred embodiment of the present invention.

As illustrated in FIG. 12, in the fifth preferred embodiment, in the first edge region C1 and the second edge region C2, a mass addition film 12 is provided on the third electrode fingers 10c and the fourth electrode fingers 10d. The material of the mass addition film 12 is not particularly limited, and for example, Pt, Au, Ta, Cu, Al, tantalum oxide, germanium oxide, silicon oxide, aluminum oxide, or the like may be used. Other points are the same or substantially the same as those in the first preferred embodiment.

Also in the fifth preferred embodiment, the ladder filter includes the series arm resonators S1 to S4 including the inclined IDT electrode and the parallel arm resonators P1 to P3 using the piston mode. Therefore, it is possible to reduce or prevent both the transverse mode ripple and the response at the upper end of the stop band.

In addition, as in the fifth preferred embodiment, the first low acoustic velocity region and the second low acoustic velocity region may be defined by providing the mass addition film 12 on the third electrode fingers 10c and the fourth electrode fingers 10d. Note that, in preferred embodiments of the present invention, the first low acoustic velocity region and the second low acoustic velocity region may be defined by providing the mass addition film 12 in addition to providing the wide portions 10c1 and 10c2, and the wide portions 10d1 and 10d2.

Sixth Preferred Embodiment

Figure 13:
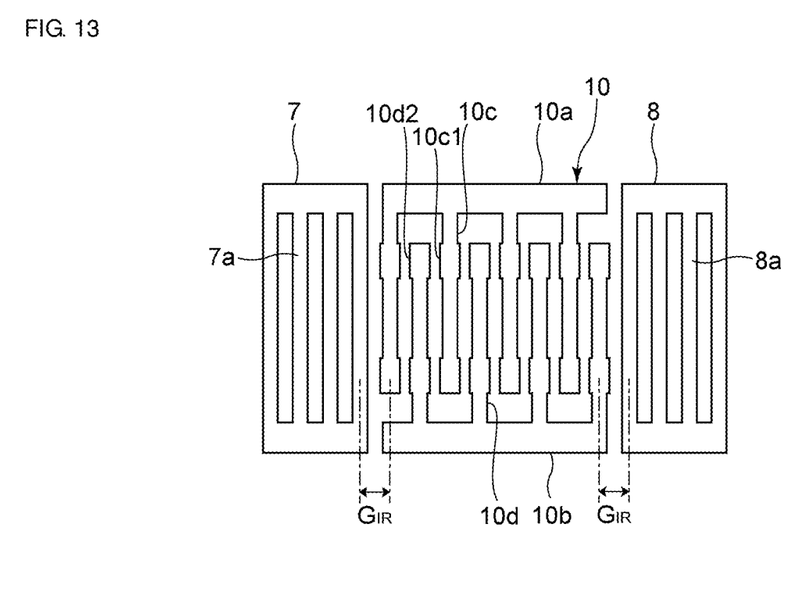
FIG. 13 is a schematic plan view illustrating an electrode structure of a parallel arm resonator in an acoustic wave device according to a sixth preferred embodiment of the present invention.

FIG. 13 is a schematic plan view illustrating an electrode structure of a parallel arm resonator constituting an acoustic wave device according to a sixth preferred embodiment of the present invention.

As illustrated in FIG. 13, the distance between electrode finger centers is defined as an IR gap $G_{IR}$ in which one electrode finger is closest to the reflector 7 among the third electrode fingers 10c and the fourth electrode fingers 10d of the second IDT electrode 10, and the other electrode finger is closest to the second IDT electrode 10 among electrode fingers 7a of the reflector 7. Similarly, the distance between electrode finger centers is also defined as the IR gap $G_{IR}$ in which one electrode finger is closest to the reflector 8 among the third electrode fingers 10c and the fourth electrode fingers 10d of the second IDT electrode 10, and the other electrode finger is closest to the second IDT electrode 10 among electrode fingers 8a of the reflector 8. In the present preferred embodiment, the IR gap $G_{IR}$ on the reflector 7 side and the IR gap $G_{IR}$ on the reflector 8 side are the same or substantially the same. Note that the IR gap $G_{IR}$ of the reflector 7 side and the IR gap $G_{IR}$ of the reflector 8 side may not necessarily be the same.

A wavelength determined by the electrode finger pitch of the second IDT electrode 10 is denoted as $\lambda 1$. A wavelength determined by the electrode finger pitch of the electrode finger 7a of the reflector 7 is denoted as $\lambda 2$. Note that the wavelength determined by the electrode finger pitch of the electrode finger 8a of the reflector 8 is also $\lambda 2$. However, the wavelength determined by the electrode finger pitch of the electrode finger 7a of the reflector 7 and the wavelength determined by the electrode finger pitch of the electrode finger 8a of the reflector 8 may be different from each other.

In the sixth preferred embodiment, the IR gap $G_{IR}$ defined as described above is preferably about 0.5 $\lambda 1$ or less, for example. Further, the wavelength $\lambda 2$ determined by the electrode finger pitch of the reflector 7 is larger than the wavelength $\lambda 1$ determined by the electrode finger pitch of the second IDT electrode 10. Other points are the same or substantially the same as those in the first preferred embodiment.

Also in the sixth preferred embodiment, the ladder filter includes the series arm resonators S1 to S4 including the inclined IDT electrode and the parallel arm resonators P1 to P3 using the piston mode. Therefore, it is possible to reduce or prevent both the transverse mode ripple and the response at the upper end of the stop band.

As in the sixth preferred embodiment, the IR gap $G_{IR}$ may be about 0.5 $\lambda 1$ or less, and the wavelength $\lambda 2$ determined by the electrode finger pitch of the reflector 7 may be larger than the wavelength $\lambda 1$ determined by the electrode finger pitch of the second IDT electrode 10. In this case, it is possible to more reliably reduce or prevent the response at the upper end of the stop band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed:
1. An acoustic wave device comprising:
  a piezoelectric body layer including a first main surface and a second main surface opposing each other;
  a high acoustic velocity member disposed on the first main surface of the piezoelectric body layer and in which an acoustic velocity of a bulk wave propagating through the high acoustic velocity member is higher than an acoustic velocity of an acoustic wave propagating through the piezoelectric body layer; and
  a plurality of IDT electrodes provided on the second main surface of the piezoelectric body layer; wherein
  a plurality of acoustic wave resonators include the piezoelectric body layer, the high acoustic velocity member, and the plurality of IDT electrodes;
  the plurality of acoustic wave resonators include at least one series arm resonator including a first IDT electrode and at least one parallel arm resonator including a second IDT electrode;
  the first IDT electrode includes a plurality of first electrode fingers and a plurality of second electrode fingers interdigitating each other;
  a first envelope which is an imaginary line connecting tips of the plurality of first electrode fingers obliquely extends with respect to an acoustic wave propagation direction and a second envelope which is an imaginary line connecting tips of the plurality of second electrode fingers obliquely extends with respect to the acoustic wave propagation direction;

the second IDT electrode includes a first busbar and a second busbar facing each other, a plurality of third electrode fingers each including an end connected to the first busbar, and a plurality of fourth electrode fingers each including an end connected to the second busbar and which are interdigitated with the plurality of third electrode fingers;

a third envelope which is an imaginary line connecting tips of the plurality of third electrode fingers extends parallel or substantially parallel to the acoustic wave propagation direction and a fourth envelope which is an imaginary line connecting tips of the plurality of fourth electrode fingers extends parallel or substantially parallel to the acoustic wave propagation direction;

the second IDT electrode includes an interdigitation region in which the third electrode fingers and the fourth electrode fingers overlap with each other in the acoustic wave propagation direction, and the interdigitation region includes a central region located in a central portion in a direction orthogonal or substantially orthogonal to the acoustic wave propagation direction, a first low acoustic velocity region disposed towards the first busbar relative to the central region and in which an acoustic velocity is lower than an acoustic velocity in the central region, and a second low acoustic velocity region disposed towards the second busbar relative to the central region and in which an acoustic velocity is lower than the acoustic velocity in the central region; and the second IDT electrode includes a first high acoustic velocity region disposed towards the first busbar relative to the interdigitation region in the direction orthogonal or substantially orthogonal to the acoustic wave propagation direction and in which an acoustic velocity is higher than the acoustic velocity in the central region, and a second high acoustic velocity region disposed towards the second busbar relative to the interdigitation region in the direction orthogonal or substantially orthogonal to the acoustic wave propagation direction and in which an acoustic velocity is higher than the acoustic velocity in the central region.

2. The acoustic wave device according to claim 1, wherein the acoustic wave device is a band pass acoustic wave filter; and
an upper end of a stop band in the at least one parallel arm resonator including the second IDT electrode is positioned within a pass band of the band pass acoustic wave filter.

3. The acoustic wave device according to claim 1, wherein the at least one parallel arm resonator includes reflectors that are provided on both sides of the second IDT electrode in the acoustic wave propagation direction and include a plurality of electrode fingers;
a wavelength determined by an electrode finger pitch of the second IDT electrode is denoted as λ1 and a wavelength determined by an electrode finger pitch of each of the reflectors is denoted as λ2; and
an IR gap, which is a distance between a center of an electrode finger positioned closest to one of the reflectors among the electrode fingers of the second IDT electrode and a center of an electrode finger positioned closest to the second IDT electrode among the electrode fingers of the one of the reflectors, is about 0.5 λ1 or less, and the λ2 is greater than the λ1.

4. The acoustic wave device according to claim 3, wherein the reflectors are made of a same material as the plurality of IDT electrodes.

5. The acoustic wave device according to claim 1, wherein the first envelope and the second envelope are each inclined by about 2.5 degrees or more with respect to the acoustic wave propagation direction.

6. The acoustic wave device according to claim 5, wherein the first envelope and the second envelope are each inclined by about 15 degrees or less with respect to the acoustic wave propagation direction.

7. The acoustic wave device according to claim 6, wherein the first envelope and the second envelope are each inclined by about 7.5 degrees with respect to the acoustic wave propagation direction.

8. The acoustic wave device according to claim 1, further comprising a low acoustic velocity film provided between the piezoelectric body layer and the high acoustic velocity member, in which an acoustic velocity of a bulk wave propagating through the low acoustic velocity film is lower than the acoustic velocity of a bulk wave propagating through the piezoelectric body layer.

9. The acoustic wave device according to claim 8, further comprising:
a support substrate; wherein
the high acoustic velocity member includes a high acoustic velocity film; and
the high acoustic velocity film is provided between the support substrate and the low acoustic velocity film.

10. The acoustic wave device according to claim 8, wherein the low acoustic velocity film is made of silicon oxide.

11. The acoustic wave device according to claim 1, wherein the high acoustic velocity member includes a support substrate.

12. The acoustic wave device according to claim 1, wherein a width that is a dimension of each of the plurality of third electrode fingers and the plurality of fourth electrode fingers in the first low acoustic velocity region and the second low acoustic velocity region along the acoustic wave propagation direction is larger than a width of each of the plurality of third electrode fingers and the plurality of fourth electrode fingers in the central region along the acoustic wave propagation direction.

13. The acoustic wave device according to claim 1, wherein each of the plurality of IDT electrodes includes a laminated metal film including an Al electrode layer laminated on a Ti electrode layer.

14. The acoustic wave device according to claim 1, wherein the piezoelectric body layer is made of lithium tantalate or lithium niobate.

15. The acoustic wave device according to claim 1, wherein in the first low acoustic velocity region and the second low acoustic velocity region, a mass addition film is laminated on the plurality of third electrode fingers and the plurality of fourth electrode fingers.

16. The acoustic wave device according to claim 1, wherein the high acoustic velocity film is made of silicon.

17. The acoustic wave device according to claim 1, wherein the acoustic wave device includes a ladder filter including the at least one series arm resonator including a plurality of the first IDT electrodes and the at least one parallel arm resonator including a plurality of the second IDT electrodes.

18. The acoustic wave device according to claim 1, wherein the first IDT electrode has a rhombic or substantially rhombic planar shape.

* * * * *